(12) United States Patent
Stimson

(10) Patent No.: US 6,554,979 B2
(45) Date of Patent: Apr. 29, 2003

(54) METHOD AND APPARATUS FOR BIAS DEPOSITION IN A MODULATING ELECTRIC FIELD

(75) Inventor: Bradley O. Stimson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/846,581

(22) Filed: May 1, 2001

(65) Prior Publication Data

US 2002/0023837 A1 Feb. 28, 2002

Related U.S. Application Data

(60) Provisional application No. 60/209,241, filed on Jun. 5, 2000.

(51) Int. Cl.$^7$ .......................... C23C 14/34; C23C 16/00; C23F 1/02
(52) U.S. Cl. ........................... 204/298.06; 204/192.12; 204/298.08; 204/298.34; 204/298.14; 118/723 R; 118/723 E; 118/723 I; 156/345.44; 156/345.45
(58) Field of Search .................. 204/192.12, 298.11, 204/298.08, 298.06, 298.34, 298.14; 118/723 R, 723 E, 723 I; 156/345.44, 345.45

(56) References Cited

U.S. PATENT DOCUMENTS

| | | | |
|---|---|---|---|
| 3,410,774 A | 11/1968 | Barson et al. | 204/192 |
| 4,756,801 A | 7/1988 | Jokinen et al. | 162/175 |
| 4,865,712 A | 9/1989 | Mintz | 204/298 |
| 4,874,493 A | 10/1989 | Pan | 204/192.11 |
| 4,874,494 A | 10/1989 | Ohmi | 204/192.12 |
| 4,963,239 A | 10/1990 | Shimamura et al. | 204/192.12 |
| 4,999,096 A | 3/1991 | Nihei et al. | 204/192.3 |
| 5,078,847 A | 1/1992 | Grosman et al. | 204/192.31 |
| 5,126,028 A | 6/1992 | Hurwitt et al. | 204/192.13 |

(List continued on next page.)

FOREIGN PATENT DOCUMENTS

| | | | |
|---|---|---|---|
| EP | 0 123 456 A2 | 10/1984 | H04N/7/12 |
| EP | 0 297 502 A2 | 6/1988 | C23C/14/34 |
| EP | 0 798 778 A2 | 10/1997 | H01L/21/768 |
| EP | 0 892 428 A2 | 1/1999 | H01L/21/768 |
| EP | 0 788 160 A3 | 6/1999 | H01L/23/522 |

OTHER PUBLICATIONS

US 5,863,392, 1/1999, Drummond et al. (withdrawn)
U.S. patent application Ser. No. 09/360,883, Paterson et al., filed Jul. 23, 1999.
U.S. patent application Ser. No. 08/768,058, Ramaswami et al., filed Dec. 16, 1996.
U.S. patent application Ser. No. 09/449,202, Gopolraja, filed Nov. 24, 1999.
U.S. patent application Ser. No. 09/454,355, Forster, filed Dec. 3, 1999.
L.J. Kochel, "Pressure control of rf bias for sputtering", Rev. Sci. Instrm., vol. 47, No. 12 (Dec. 1976), pp.1555–1557.
Suzuki, et al., "Microwave plasma etching", Pergamon Press Ltd., vol. 34, No. 10/11 (1984) pp. 953–957.

(List continued on next page.)

Primary Examiner—Steven H. VerSteeg
(74) Attorney, Agent, or Firm—Moser, Patterson & Sheridan, LLP

(57) ABSTRACT

The present invention provides a method and apparatus for achieving conformal step coverage of one or more materials on a substrate using sputtered ionized material. In one embodiment, a chamber having one or more current return plates, a support member, an electromagnetic field generator and a support member is provided. The target provides a source of material to be sputtered by a plasma and then ionized by an inductive coil, thereby producing electrons and ions. During processing, a bias is applied to the support member by an RF power source. The return plates are selectively energized to provide a return path for the RF currents, thereby affecting the orientation of an electric field in the chamber.

35 Claims, 9 Drawing Sheets

U.S. PATENT DOCUMENTS

| | | | |
|---|---|---|---|
| 5,262,354 A | 11/1993 | Cote et al. .................. 437/195 |
| 5,302,266 A | 4/1994 | Grabarz et al. ........ 204/192.12 |
| 5,303,139 A | 4/1994 | Mark .......................... 363/63 |
| 5,345,145 A * | 9/1994 | Harafuji et al. ......... 315/111.41 |
| 5,346,600 A | 9/1994 | Nieh et al. ............... 204/192.3 |
| 5,376,584 A | 12/1994 | Agarwala ................... 437/183 |
| 5,486,492 A | 1/1996 | Yamamoto et al. ......... 437/192 |
| 5,510,011 A | 4/1996 | Okamura et al. ........ 204/192.3 |
| 5,584,974 A | 12/1996 | Sellers .................. 204/192.13 |
| 5,585,673 A | 12/1996 | Joshi et al. ................. 257/751 |
| 5,585,974 A | 12/1996 | Shrinkle ..................... 360/46 |
| 5,612,254 A | 3/1997 | Mu et al. ..................... 437/195 |
| 5,639,357 A | 6/1997 | Xu .......................... 204/192.3 |
| 5,651,865 A | 7/1997 | Sellers .................. 204/192.3 |
| 5,693,563 A | 12/1997 | Teong ........................ 437/190 |
| 5,718,813 A | 2/1998 | Drummond et al. ... 204/192.12 |
| 5,725,739 A | 3/1998 | Hu .......................... 204/192.3 |
| 5,731,245 A | 3/1998 | Joshi et al. ................. 438/705 |
| 5,744,376 A | 4/1998 | Chan et al. ................. 437/190 |
| 5,759,906 A | 6/1998 | Lou ........................... 438/623 |
| 5,770,023 A | 6/1998 | Sellers .................... 204/192.3 |
| 5,780,357 A | 7/1998 | Xu et al. ..................... 438/639 |
| 5,807,467 A | 9/1998 | Givens et al. ......... 204/192.12 |
| 5,810,963 A | 9/1998 | Tomioka .................... 156/345 |
| 5,810,982 A | 9/1998 | Sellers .................. 204/298.08 |
| 5,858,184 A | 1/1999 | Fu et al. ................. 204/192.17 |
| 5,904,565 A | 5/1999 | Nguyen et al. ............. 438/687 |
| 5,933,753 A | 8/1999 | Simon et al. ............... 438/629 |
| 5,966,634 A | 10/1999 | Imohara et al. ............. 438/687 |
| 5,968,327 A | 10/1999 | Kobayashi et al. .... 204/298.11 |
| 5,976,327 A | 11/1999 | Tanaka .................. 204/192.15 |
| 6,001,420 A | 12/1999 | Mosely et al. .............. 427/258 |
| 6,051,114 A | 4/2000 | Yao et al. ................. 204/192.3 |
| 6,099,687 A * | 8/2000 | Yamazaki ................... 156/345 |
| 6,264,812 B1 * | 7/2001 | Raaijmakers et al. .. 204/298.06 |

OTHER PUBLICATIONS

Rossnagel, et al., Collimated magnetron sputter deposition with grazing angle ion bombardment, J. Vac. Sci Tech, vol. 13, No. 1 (Jan./Feb. 1995), pp. 156–158.

Yasui, et al., "Electron cyclotron resonance plasma generation using a planar ring–cusp magnetic field and reentrant coaxial cavity", J. Vac. Sci. Tech., vol. 13, No. 4 (Jul./Aug. 1995), pp.2105–2109.

Holber, et al., "Copper deposition by electron cyclotron resoance plasma", J. Vac. Sci. Tech., vol. 11, No. 6 (Nov./Dec. 1993), pp.2903–2910.

Cheng, et al., "Directional deposition of Cu into semiconductor trench structures using ionized magnetron sputtering", J. Vac. Sci. Tech., vol. 13, No. 2 (Mar./Apr. 1995), pp.203–208.

P. Kidd, "A Magnetically confined and electron cyclotron resonance heated plasma machine for coating and ion surface modification use", J. Vac. Sci. Tech., vol. 9, No. 3(May/Jun. 1991), pp.466–473.

M. Yamashita, "Fundamental characteristics of buitl–in high–frequency coil–type sputtering apparatus", J. Vac. Sci. Tech., 7(2) (Mar./Apr. 1989), pp.151–158.

S. Samukawa, "Wave propogation and plasma uniformity in an electron cyclotron resoance plasma", J. Vac. Sci. Tech., 11(5) (Sep./Oct. 1993), pp. 2575–2576.

Apblett, et al., "Silicon nitride growth in a high–density plasma system", Solid State Tech, (Nov. 1995), pp.73–74 & 78 and 80.

Suzuki, et al., "Microwave Plasma Etching". J. App. Phys, 16(11) (Nov. 1977), pp.1979–1984.

Getty, et al., "Size–scalable 2.45 GHz electron cyclotrom resonance plasma source using permanent magnets and waveguide coupling", J. Vac. Sci. Tech., 12(1) (Jan./Feb. 1994), pp. 408–415.

Hamaguchi, et al., Simulations of trench–lling pros les under ionzies magnetron sputter metal deposition;, J. Vac. Sci. Tech, 13(2) (Mar./Apr. 1995), pp. 183–191.

"Endpoint Detection method for Ion Etching of a Material Having a titanium Nitride Underlayer", Research Disclosure, Feb. 1991, No. 322, Kenneth Mason Publications Ltd. England.

Novellus Damascus Home Page, "12 Steps of Damascus".

S. Matsuo, "Reactive ion–beam etching and plasma deposition techniques using electron cyclotron resoance plasma, "Appl. Sol. State Sci, Academic Press (1985), pp. 75–117.

Gorbatkin, et al., Cu metallization uding a permanent magnet electron cyclotron resonance microwave plasma sputtering hybrid system, J. Vac. Sci. Tech, 14(3) (May/Jun. 1996), pp.1853–1859.

Park, et al., A novel A–1 reflow process using surface modification by the ECR plasma treatment and its application to the 256Mbit DRAM, IEDM 94, 109–112, pp.5.4.1–5.5.5 (1994).

Koenig, et al., RF sputtering system with a variabl substrate bias, IBM Tech, Discl. Bull 13(2) (Jul. 1970), pp. 323–324.

* cited by examiner

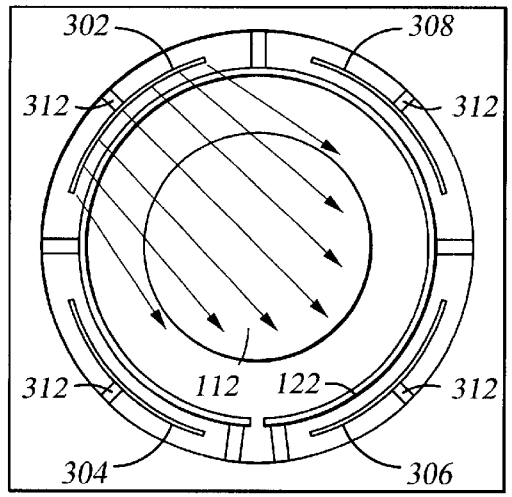
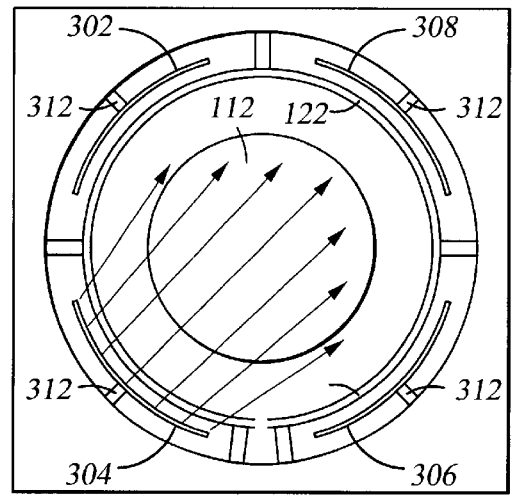
Fig. 8
Fig. 9
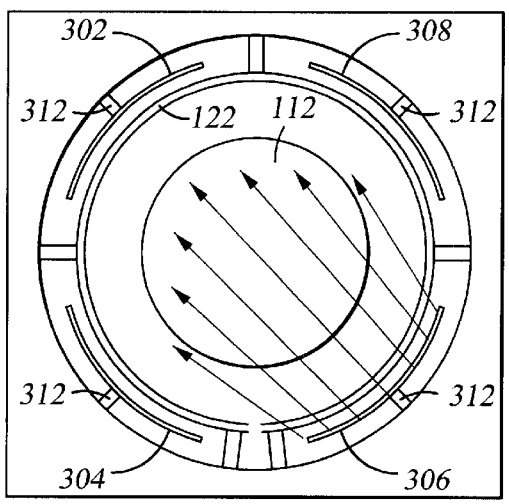
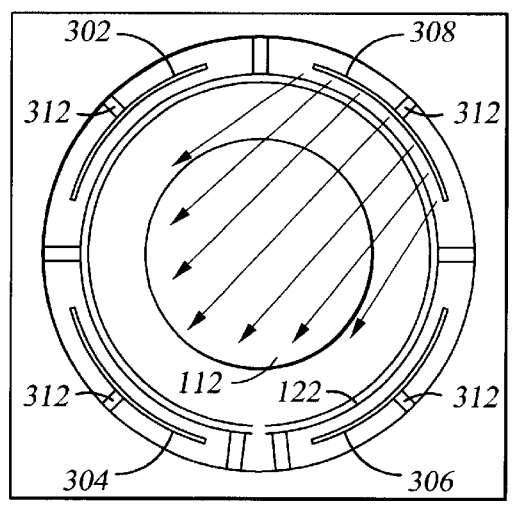
Fig. 10
Fig. 11

METHOD AND APPARATUS FOR BIAS DEPOSITION IN A MODULATING ELECTRIC FIELD

This application claims the benefit of Provisional application Ser. No. 60/209,241, filed Jun. 5, 2000.

BACKGROUND OF THE INVENTION

1. Field of the Invention

The present invention relates to an apparatus and method for processing substrates. Specifically, the invention relates to a method for depositing a conformal layer of material on a substrate in an ionized metal plasma process.

2. Background of the Related Art

Sub-quarter micron multi-level metallization represents one of the key technologies for the next generation of ultra large-scale integration (ULSI) for integrated circuits (IC). In the fabrication of semiconductor and other electronic devices, directionality of particles being deposited on a substrate is important to improve in filling of electric features. As circuit densities increase, the widths of vias, contacts and other features, as well as the dielectric materials between them, decrease to 0.25 μm or less, whereas the thickness of the dielectric layer remains substantially constant. Thus, the aspect ratios for the features, i.e., the ratio of the depth to the minimum lateral dimension, increases, thereby pushing the aspect ratios of the contacts and vias to 5:1 and above. As the dimensions of the features decrease, it becomes even more important to get directionality in order to achieve conformal coverage of the feature sidewalls and bottoms.

Conventionally, physical vapor deposition (PVD) systems have been used to deposit materials in device features formed on a substrate. PVD systems are well known in the field of semiconductor processing for forming metal films. Generally, a power supply connected to a processing chamber creates an electrical potential between a target and a substrate support member within the chamber and generates a plasma of a processing gas in the region between the target and substrate support member. Ions from the plasma bombard the negatively biased target and sputter material from the target which then deposits onto a substrate positioned on the substrate support member. However, while such processes have achieved good results for lower aspect ratios, conformal coverage becomes difficult to achieve with increasing aspect ratios. In particular, it has been shown that coverage of the bottoms of the vias decreases with increasing aspect ratios.

One process capable of providing greater directionality to particles is ionized metal plasma-physical vapor deposition (IMP-PVD), also known as high density physical vapor deposition (HDP-PVD). Initially, a plasma is generated by introducing a gas, such as helium or argon, into the chamber and then coupling energy into the chamber via a biased target to ionize the gas. A coil positioned proximate the processing region of the chamber produces an electromagnetic field which induces currents in the plasma resulting in an inductively-coupled medium/high density plasma between a target and a susceptor on which a substrate is placed for processing. The ions and electrons in the plasma are accelerated toward the target by a bias applied to the target causing the sputtering of material from the target by momentum transfer. A portion of the sputtered metal flux is then ionized by the plasma to produce metal ions in the case where the target comprises a metal. An electric field due to an applied or self-bias, develops in the boundary layer, or sheath, between the plasma and the substrate that accelerates the metal ions towards the substrate in a vector parallel to the electric field and perpendicular to the substrate surface. The bias energy is preferably controlled by the application of power, such as RF or DC power, to the susceptor to attract the sputtered target ions in a highly directionalized manner to the surface of the substrate to fill the features formed on the substrate.

One of the problems with HDP-PVD processes is the inability to achieve conformal step coverage in the increasingly smaller device features. Conformal coverage of the bottom and sidewalls of the features is needed to optimize subsequent processes such as electroplating. Electroplating requires conformal barrier and seed layers within the device features in order to ensure uniform filling of the feature. While conventional HDP-PVD achieves good bottom coverage due to the directionality of the ions provided by the bias on the substrate, the sidewall coverage can be less than conformal. This result is caused in part by the induced high directionality of ions towards the bottom of the features with little directionality toward the sidewalls.

The effects of a bias on a substrate can be described with reference to FIGS. 1–2 which illustrate the direction of metal ions 14 entering a via 16 formed on a substrate 10. FIG. 1 illustrates a PVD processing environment wherein no bias is supplied to the substrate 10. As a result, the directionality of the ions 14 is determined primarily by the ejection profile of material (usually atoms) from the target and by the inelastic collisions with other particles in the chamber, such as Ar ions which are provided in a plasma. The angular distribution 22 of the ions 14 in FIG. 1 typically results in little deposition on the bottom 18 of the via 16 due to a large proportion of the ions 14 striking the substrate 10 at oblique angles.

FIG. 2 illustrates the processing environment in a HDP-PVD process wherein the angular distribution of the ions 14 is influenced by the electrical field E due to the applied or self-bias at the surface of the substrate. The electric field E is oriented perpendicular to the substrate 10 and the positively charged ions 14 travel along a trajectory parallel to the electric field E toward the bottom 18 of the via 16. The angular distribution 24 of the ions 14 in FIG. 2 is typically results in moderate to low deposition on the sidewalls 20 and high to moderate deposition on the bottom 18 than is possible without the bias. As compared to the angular distribution 22 of FIG. 1, the distribution 24 exhibits a tighter pattern indicating more directionality parallel to the electric field E.

One of the reasons for poor sidewall coverage of device features in HDP-PVD processes is the orientation of the electric field E shown in FIG. 2. The electric field E extends between the substrate and a chamber component that provides a return path for the RF currents supplied to the support member during processing. Typically, the chamber component is an annular conductive member, such as a metal process shield, disposed proximate to the substrate. Additionally, the chamber component is grounded to support the flow of current to ground.

A schematic representation of a chamber 25 having a substrate support 26, a coil 30 and grounded conductive process shield 27 is shown in FIG. 3. A substrate 28 is disposed on the substrate support 26 for processing and a plasma 29 is maintained in the chamber 25 near the substrate 28. Due to the annular shape of the process shield 27, the field lines of the electric field E between the plasma 29 and the substrate 28 are uniformly distributed with a substantial vertical component relative to the substrate 28. As a result, during processing, ions experience a force due to the electric field E causing the ions to be accelerated down toward the bottoms of the device features formed in the substrate 28 with little direction toward the sidewalls of the features.

Therefore, there is a need to provide a technique for depositing a layer conformally over the surface of features, particularly sub-half micron and higher aspect ratio features.

SUMMARY OF THE INVENTION

The present invention generally provides an apparatus and method for depositing a conformal layer on device features in a plasma chamber using sputtered ionized material. In one embodiment, a chamber having a target, a substrate support member and a magnetic field generator to ionize the target material is provided. The target comprises the material to be sputtered by a plasma formed adjacent to the target during processing. The magnetic field generator may be one or more single-turn or multi-turn coils adapted to ionize the sputtered material. The invention provides methods and apparatus adapted to affect the angular distribution of ions present in the chamber.

In one aspect of the invention, a method of modulating the orientation of an electric field between the support member and one or more current return plates is provided. The electric field is generated by applying a reference signal to the support member and providing a current return path through one or more of the return plates. A phase shifted reference signal provided to one or more of the return plates determines the return path of the currents. Preferably, the electric field is rotated about a central axis of the processing chamber at a desired frequency. Additionally, the electric field strength may be modulated by varying the signal power supplied to the support member. A reference signal is provided to the support member to supply a bias to a substrate disposed thereon.

In another aspect of the invention, an apparatus is provided having one or more return plates disposed in the chamber. The return plates and the support member are each coupled to a signal source adapted to produce a reference signal and a phase shifted reference signal. Preferably, the apparatus includes a phase shift network disposed between the signal source and the return plates wherein the phase shift network is adapted to further split an input signal.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIGS. 8–11 are side views of the chamber of FIGS. 4–5 and 7 showing orientations of the electric field varying with intensity.

DETAILED DESCRIPTION OF THE PREFERRED EMBODIMENT

The embodiments described below preferably use a modified ionized metal plasma (IMP) process that can be carried out using process equipment, such as an Endura® platform, available from Applied Materials, Inc., located in Santa Clara, Calif. with modifications as described below. The equipment preferably includes an integrated platform having a preclean chamber, an IMP-PVD barrier layer chamber, a PVD chamber, an IMP-PVD seed layer chamber, and a CVD chamber. One ion metal plasma (IMP) processing chamber, known as an IMP VECTRAM™ chamber is available from Applied Materials, Inc., of Santa Clara, Calif. While embodiments of the present invention are described with reference to an IMP chamber, any chamber configured for bias deposition may be used to advantage.

Figure 4:
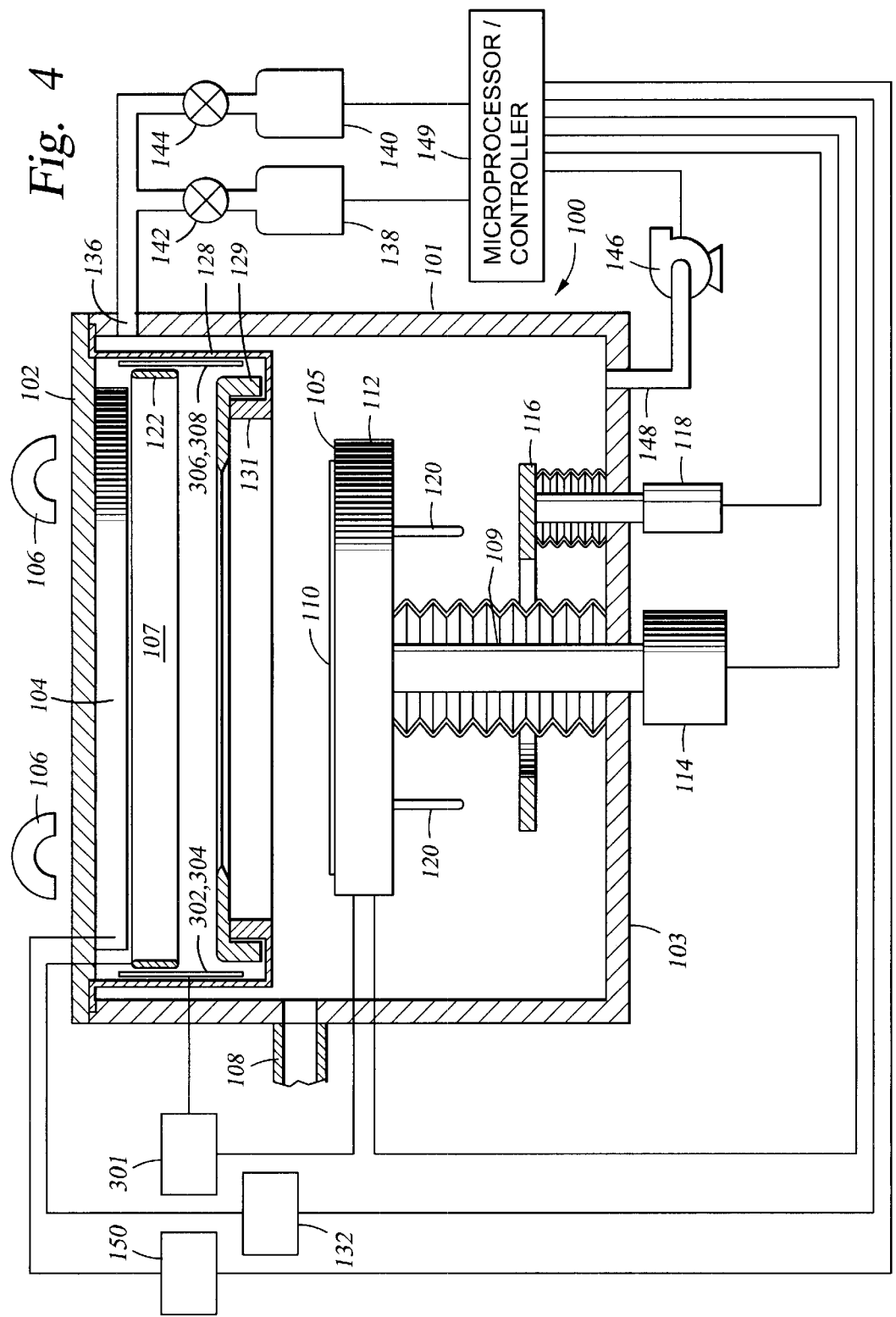
FIG. 4 is a cross section of a simplified processing chamber of the invention using a coil.

FIG. 4 is a schematic cross-sectional view of an IMP chamber 100 according to the present invention. The chamber 100 includes walls 101, lid 102, and bottom 103. A target 104 comprising the material to be sputtered is mounted to the lid 102 and disposed in the chamber 100 to define an upper boundary to a processing region 107. Magnets 106 are disposed behind the lid 102 and are part of a rotatable magnetron which trap electrons during operation and increase the density of a plasma adjacent to the target 104. A substrate support member 112 is movably disposed in the chamber 100 and in a raised processing position defines the lower boundary to the processing region 107. The substrate support member 112 provides an upper support surface 105 for supporting a substrate 110. The support member 112 is mounted on a stem 109 connected to a motor assembly 114 that raises and lowers the substrate support 112 between a lowered loading/unloading position and the raised processing position. An opening 108 in the chamber 100 provides access for a robot (not shown) to deliver and retrieve substrates 110 to and from the chamber 100 while the substrate support member 112 is in the lowered loading/unloading position. A lift plate 116 connected to a lift motor 118 is mounted in the chamber 100 and raises and lowers pins 120. The pins 120 are mounted in the support member 112, and raise and lower the substrate 110 to and from the upper support surface 105 of the support member 112.

A coil 122 is mounted in the chamber 100 between the substrate support member 112 and the target 104 and provides magnetic fields in the chamber 100 during processing to assist in generating and maintaining a plasma between the target 104 and substrate 110. The magnetic fields produced by the coil 122 induce currents in the plasma to produce a denser plasma which, in turn, ionizes the material sputtered from the target 104. The ionized material is then directed toward the substrate 110 and deposited thereon.

The chamber 100 includes a process kit comprising a process shield 128 and a shadow ring 129. The process shield 128 is annular member suspended from the lid 102 between the coil 122 and the body 101. An upwardly turned wall 131 of the process shield 128 is adapted to support the shadow ring 129 while the support member 112 is in a lowered position.

A plurality of return plates 302, 304, 306, 308 are disposed in the chamber 100. The return plates 302, 304, 306, 308 provide return paths for RF currents in the chamber 100 during processing and are described in more detail below.

One or more plasma gases are supplied to the chamber 100 through a gas inlet 136 from gas sources 138, 140 as metered by respective mass flow controllers 142, 144. A vacuum system 146 is connected to the chamber 100 at an exhaust port 148 to exhaust the chamber 100 and maintain the desired pressure in the chamber 100. Preferably, the vacuum system 146 includes a cryopump and a roughing pump and is capable of sustaining a base pressure of about $10^{-8}$ mTorr.

Multiple signal generators/power supplies are used in the chamber 100. A first signal generator 150 coupled to the target 104 provides a signal thereto. While the first signal generator 150 preferably provides a DC signal, in another embodiment an RF signal may be provided to the target 104. A second signal generator 132 supplies electrical power in the megahertz range to the coil 122 to increase the density of the plasma. A signal modulation system 301 provides a signal, preferably RF or DC, to the substrate support member 112 to bias the substrate 110 disposed thereon during processing. The signal modulation system 301 is also coupled to each of the plates 302, 304, 306, 308 to provide return paths for current flowing from the respective plates.

Figure 5:
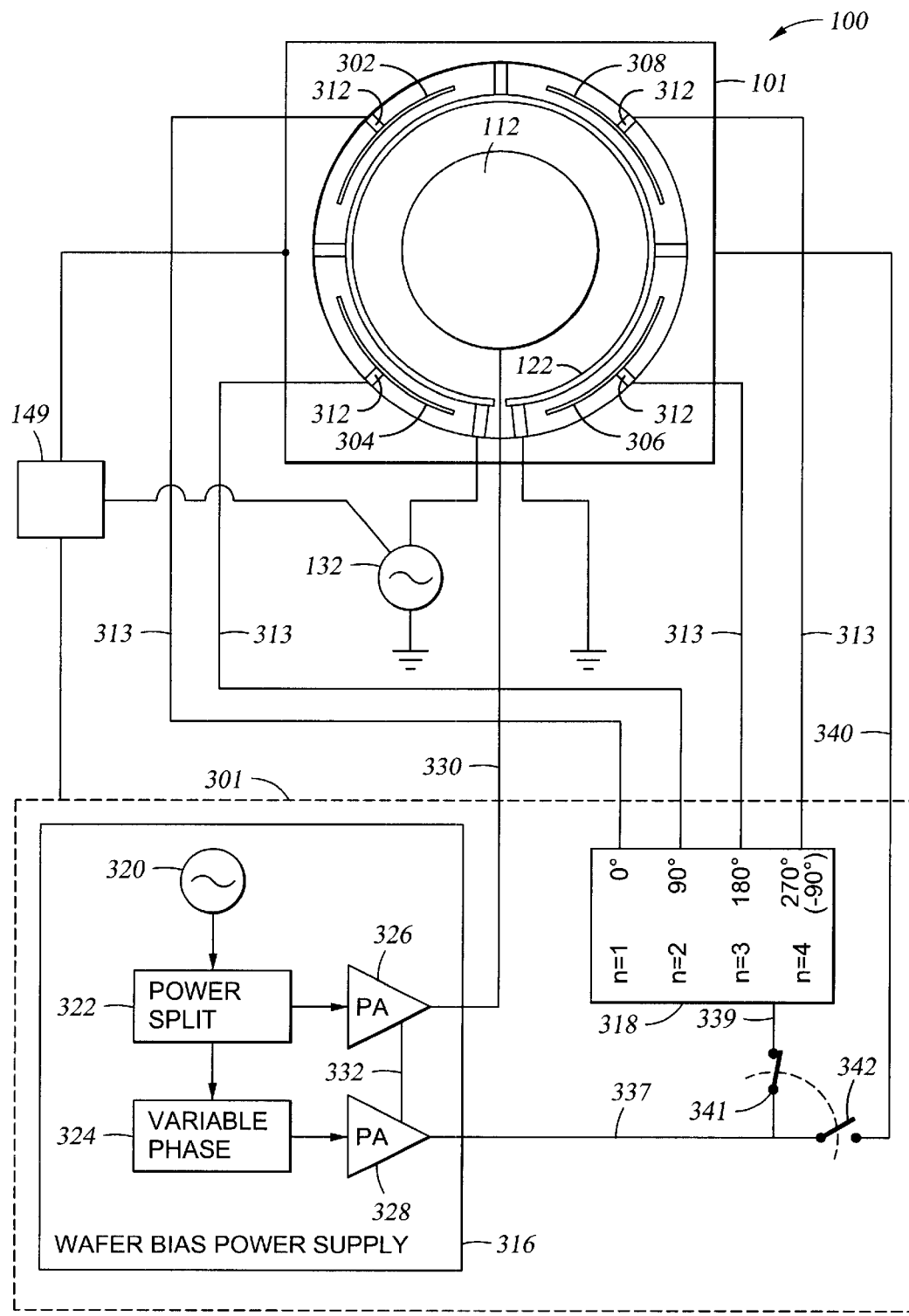
FIG. 5 is a top view of the chamber of FIG. 4 with modifications and having a phase shift system coupled thereto.

FIG. 5 is a simplified top schematic view of the IMP chamber 100 showing the orientation of the return plates 302, 304, 306, 308 and the components of the signal modulation system 301. The plurality of return plates 302, 304, 306, 308 are shown disposed symmetrically about the chamber 100. In the embodiment of FIG. 5, four return plates 302, 304, 306, 308 are shown but any number of plates may be used to advantage. Illustratively, each plate 302, 304, 306, 308 has a surface area of at least 2 in$^2$ and is made of a conductive material such as stainless steel, aluminum and/or titanium. The plates 302, 304, 306, 308 are mounted to the chamber body 101 by a bracket 312 which preferably comprises an insulating material such as ceramic. A ceramic provides good insulation properties and its thermal conductivity. A material having good thermal conductivity facilitates transference of heat away from the plates and to the process shield 128. In a particular embodiment, the bracket 312 is made of aluminum nitride or aluminum oxide.

Preferably, the return plates 302, 304, 306, 308 are positioned between the chamber walls 101 and the coil 122 and most preferably between the coil 122 and the process shield 128 (shown in FIG. 7 described below). Placing the return plates 302, 304, 306, 308 outside the diameter of the coil 122 avoids impedance of the coupling of the coil 122 to the plasma. If the return plates 302, 304, 306, 308 are placed inside the coil diameter, eddy currents induced in the plates may significantly reduce the magnetic field coupled to the plasma by the coil 122, thereby reducing coupling efficiency. Although eddy currents may still be present in the return plates 302, 304, 306, 308 when the plates are placed outside the coil diameter, their effect is mitigated relative to when the plates are place inside the coil diameter.

A plurality of conductive input cables 313 are coupled at their terminal ends to the plates 302, 304, 306, 308 and extend axially through the insulating bracket 312 and through chamber body 101. The cables 313 are coupled at one end to the signal modulation system 301 which may be located remotely or proximately to the chamber 100.

The signal modulation system 301 generally includes a signal source 316 and a phase shift network 318 coupled to the signal source 316. The signal source 316 further includes a waveform generator 320, such as a low power oscilloscope, a power splitter 322, a variable phase modulator 324, and a pair of amplifiers 326, 328 coupled to each of the power splitter 322 and variable phase modulator 324, respectively. The first amplifier 326 is connected by an output cable 330 to the substrate support member 112 while the second amplifier 328 is connected to the phase shift network 318. The amplifiers 326, 328 are coupled by a common isolated return 332 so that both outputs are tied to a common reference and so that return currents only run through the return plates 302, 304, 306, 308 and not through any other path.

The phase shift network 318 operates as a signal splitter and fixed phase shifter to generate multiple phase shifted signals from a single input signal supplied by the signal source 316. In the embodiment shown, the phase shift network 318 generates four output signal to each of the four input cables 313. However, the number of output signals is dependent on the number of return plates 302, 304, 306, 308 disposed in the chamber 100 which may be varied according to a particular application. Further, the phase shift network 318 operates to phase shift each of the output signals relative to one another by a magnitude equal to 360"/N, where N equals the number of return plates 302, 304, 306, 308. Thus, for an embodiment having four plates 302, 304, 306, 308, shown in FIG. 5, N=4 and 360°/4=90° so that an input signal from the second amplifier 328 of the signal source 316 is split four ways and the resulting split signals are then phase shifted in multiples of 90° relative to one another. As a result, in one embodiment, the phase shift experienced by each of four split signals relative to a signal supplied by the signal source 316 is 0°, 90°, 180° and 270°(or −90°) for the first plate 302, second plate 304, third plate 306, forth plate 308, respectively.

The signal supplied to the phase shift network 318 is generated by the signal source 316. Initially, a reference signal is generated by the waveform generator 320. The reference signal can be sinusoidal, sawtooth, square, etc. The reference signal is then split by the splitter 322 and supplied to the first amplifier 326 and the phase modulator 324, respectively. The first amplifier 326 outputs an amplified reference signal to the support member 112 to provide a bias to a substrate disposed thereon. Simultaneously, the phase modulator 324 outputs a phase shifted reference signal to the second amplifier 328 which then provides an amplified phase shifted signal to the phase shift network 318. By "phase shifted reference signal" is meant that the signal output from the phase modulator 324 is shifted relative to the input reference signal by some quantity Δ, where Δ varies within a predetermined range, such as 0°–360° for example. The phase shift network 318 then splits and further phase shifts the amplified phase shifted reference signal in the manner described above. As a result, four separate signals are output to each of the four return plates 302, 304, 306, 308 and the four separate signals are each phase shifted relative to the reference signal by some quantity Δ+Xn, where Xn equals the phase shift contributed by the phase shift network 318. In one embodiment, Xn is defined by Equation 1.

Equation 1: $X_n=(360/N)(n-1)$, where N is the total number of outputs from the phase shift network 318 and n is the specific output (starting with 1) from the phase shift network 318.

Figure 6:
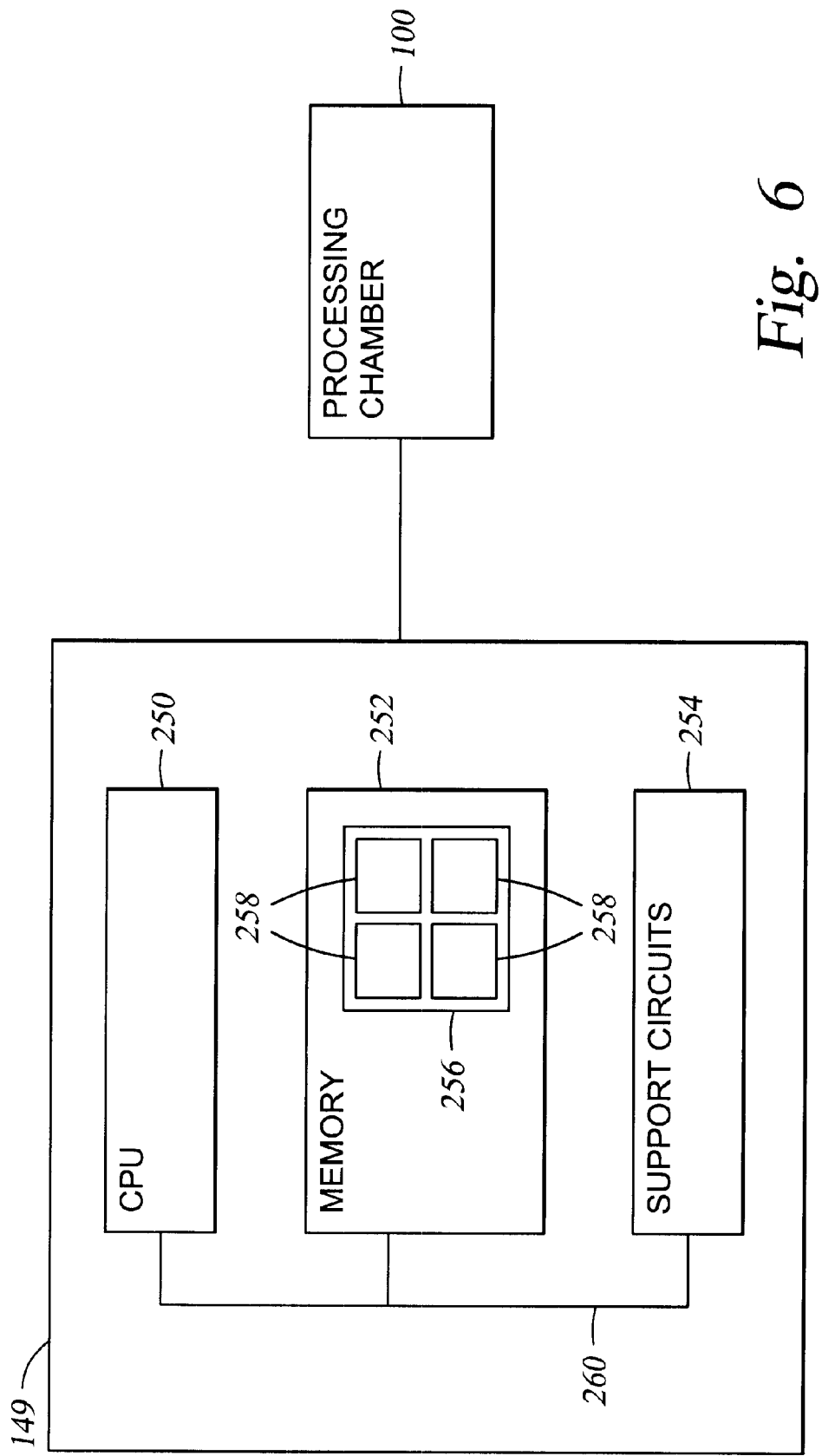
FIG. 6 is a schematic illustration of a controller used to control the processing system shown in FIG. 4.

The operation of the chamber 100 and the various related components are preferably controlled by a controller 149. In particular, the controller 149 generates signals that control the operation of signal generators 132, 150 and 301 as required to perform the processes of the invention described below. A schematic representation of the controller 149 is shown in FIG. 6. The controller 149 comprises a bus line 260 coupling a central processing unit (CPU) 250, a memory 252, and support circuits 254 for the CPU 250. The CPU 250 may be any general purpose computer processor that can be used in an industrial setting for controlling various chambers and subprocessors. The support circuits 254 are coupled to the CPU 250 for supporting the processor in a conventional manner. These circuits include cache, power supplies, clock circuits, input/output circuitry and subsystems, and the like. The memory 252, or computer-readable medium, is coupled to the CPU 250 and may be one or more of readily available memory such as random access memory (RAM), read only memory (ROM), floppy disk drive, hard disk, or any other form of digital storage, local or remote. A deposition process is generally stored in the memory 252, typically as a software routine 256, or program product. The software routine 256 may also be stored and/or executed by a second CPU (not shown) that is remotely located from the hardware being controlled by the CPU 250. The software routine 256 includes multiple subroutines 258 each of which are adapted to perform the various operations described below.

In operation, a robot delivers a substrate 110 to the chamber 100 through the opening 108. After depositing the substrate 110 unto the upper surface 105 of the support member 112 the robot retracts from the chamber 100 and the opening 108 is sealed. The substrate support member 112 then raises the substrate 110 into a processing position. During the upward movement of the support member 112 the shadow ring 129 is lifted from the process shield 128. During processing, the shadow ring 129 covers a perimeter portion (a few millimeters) of the substrate 110. Preferably, the distance between the target 104 and the substrate support member 112 in a raised processing position is about 90–160 mm for a 200 mm chamber operating between about 10 mTorr and 70 mTorr. One or more plasma gases are then introduced into the chamber 100 from the gas sources 138, 140 to stabilize the chamber 100 at a processing pressure. The magnets 106, which comprises components of a magnetron, then facilitate the formation of a plasma adjacent the target 104 and the first signal generator 150 provides a bias which attracts the charged particles of the plasma toward the target 104 to cause sputtering therefrom. The coil 122 is energized by the second signal generator 132 and operates to increase the density of the plasma, thereby facilitating ionization of sputtered target material. A portion of the ions formed from the sputtered target material continue to traverse the processing region 107 between the target 104 and the support member 112 and deposit on the substrate 110. Deposition onto the substrate 110 is enhanced by a bias on the substrate 110 provided by the signal source 316. The biases to the target 104 and support member 112 are controlled according to the processes described in detail below.

Following the deposition cycle, the substrate support member 112 is lowered to a loading/unloading position. The robot is then extended into the chamber 100 through the opening 108 and the substrate 110 is placed on the robot for removal from the chamber 100 and delivery to a subsequent location. Subsequent locations include various processing chambers, such as electroplating chambers, where the substrate 110 undergoes additional processing.

The directionality of the material sputtered from the target 104 during processing is determined, in part, by the voltage drop between the plasma and the substrate 110 due to the applied or self-bias on the substrate 110. The voltage drop occurs in a region known as the sheath and effects an electrical field perpendicular to the substrate 110 which provides directionality of the ionized target material toward the substrate 110, thereby enhancing bottom coverage of the device feature. In order to achieve improved step coverage, the invention modulates the electric field present in the sheath to ensure the proper proportions of bottom coverage and sidewall coverage.

Figure 1:
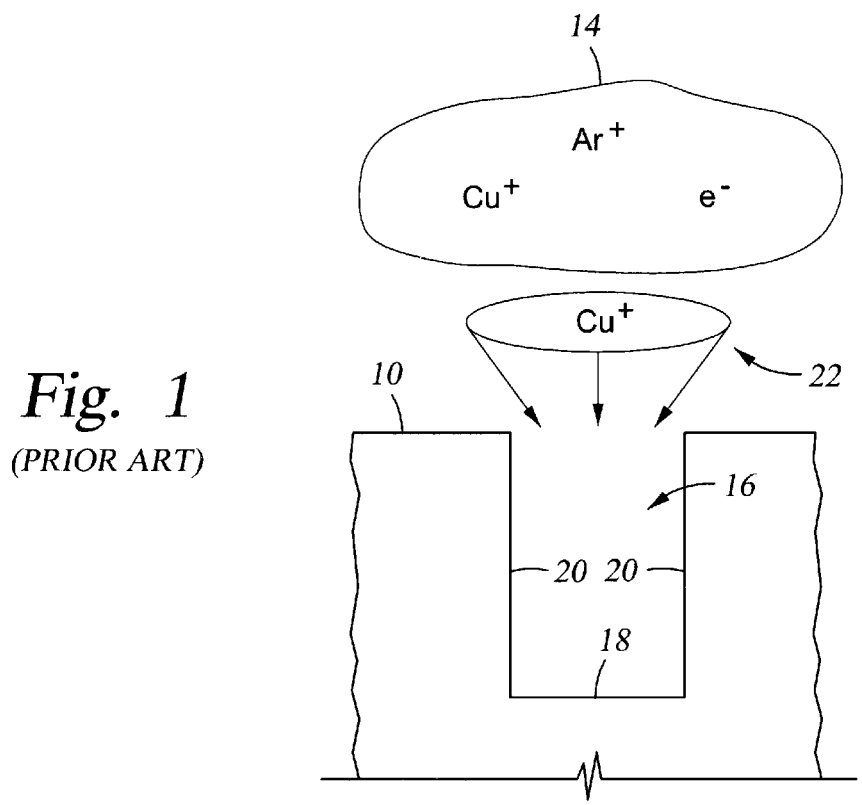
FIG. 1 is a cross section of a substrate having a via formed therein and illustrates a cosine distribution.
Figure 2:
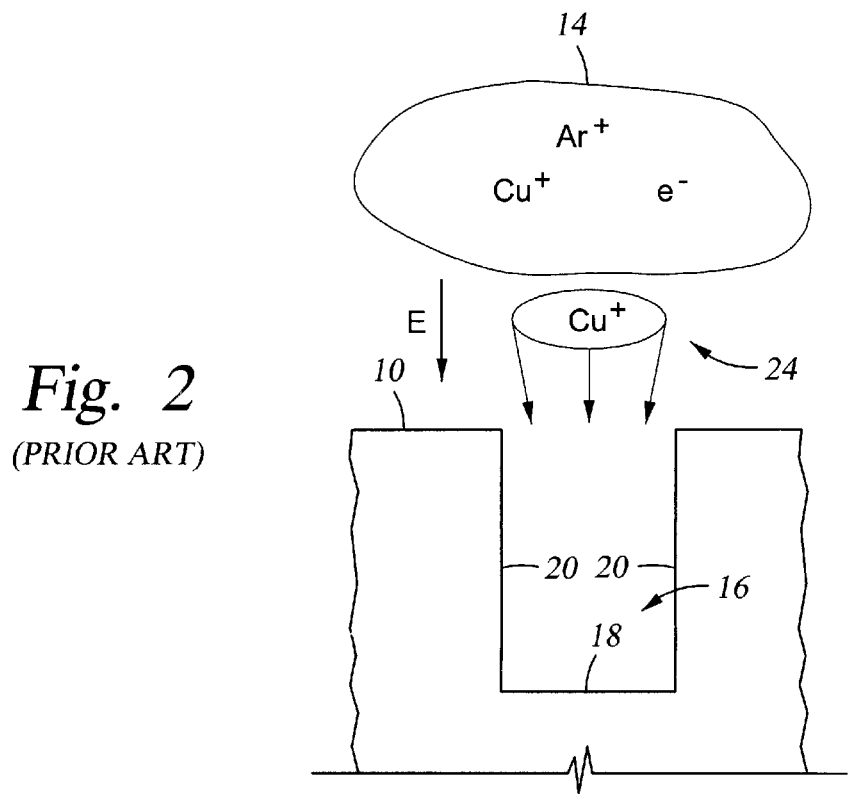
FIG. 2 is a cross section of a substrate having a via formed therein and illustrates an over-cosine distribution.
Figure 3:
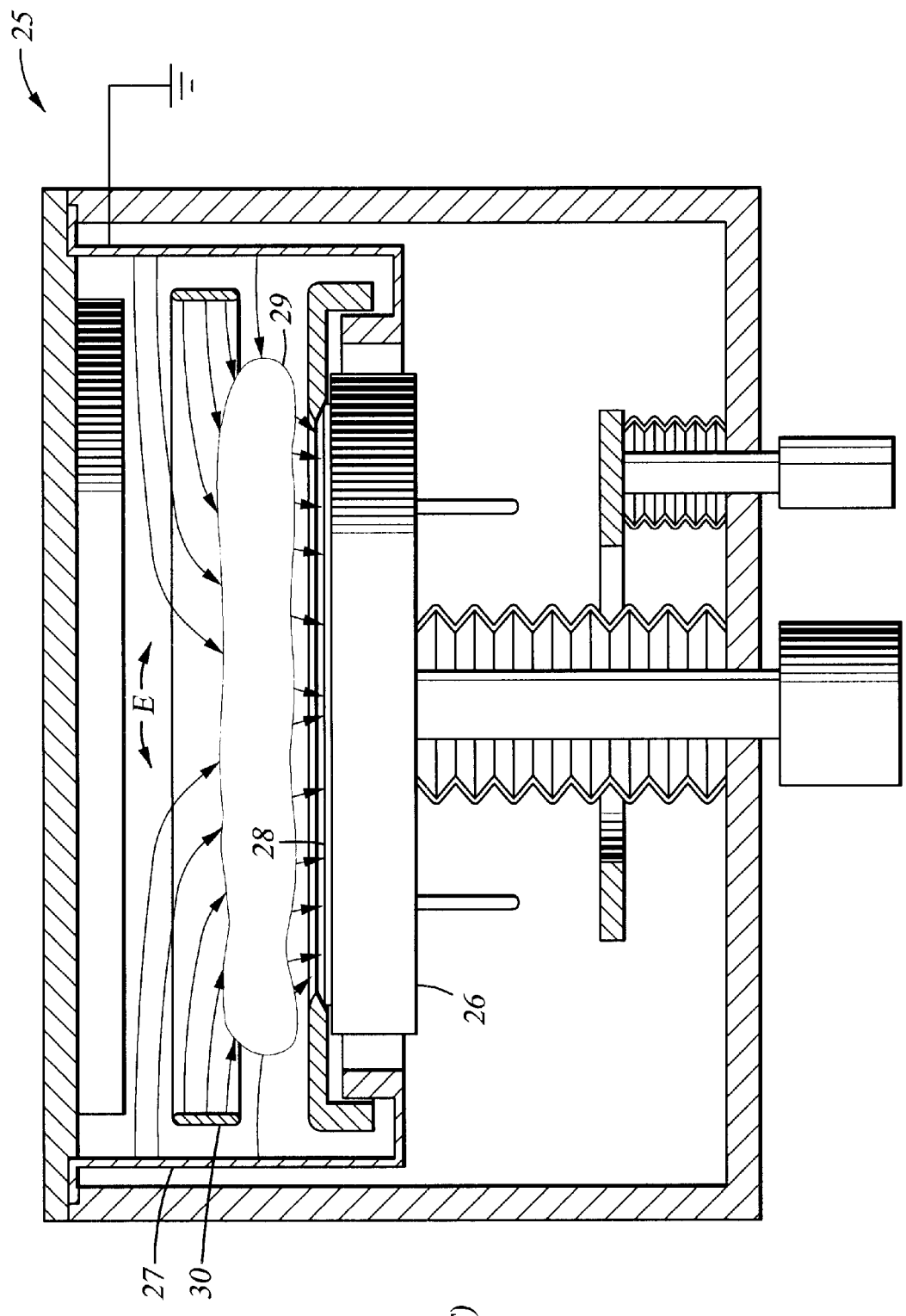
FIG. 3 is a cross section of a simplified typical processing chamber using a coil and illustrating an electric field therein.

During processing, the return path of the substrate bias signal through the plates 302, 304, 306, 308 is modulated to affect the electric field in the sheath. A return path is needed to establish a complete circuit through which the RF currents from the substrate being processed can travel. Conventional methods and chambers utilizing a substrate bias provide a static, i.e., unchanging, return path for the currents produced by the bias signal such as by positioning a grounded annular process shield in the chamber such as is shown in FIG. 3 and described above. The present invention modulates the return path to provide additional control over the processing conditions.

The affinity of the RF currents in the chamber 100 for one of the plates 302, 304, 306, 308 is determined by the degree of phase shift of the signal input to each of the plates 302, 304, 306, 308 relative to the reference signal supplied to the support member 112. The further out of phase the signal supplied to a given plate 302, 304, 306, 308 is relative to the reference signal, the greater the affinity of the current for that particular plate. Thus, where the signal applied to a given return plate 302, 304, 306, 308 is 180° out of phase relative to the reference signal, i.e., the quantity $\Delta+X_n=180°$, the given return plate provides the strongest return path for the RF currents. Conversely, where the signal to the given plate is completely in phase with the reference signal, i.e., the quantity $\Delta+X_n=0°/360°$, the given plate provides no return path for the RF currents. Thus, the RF currents will be at a maximum through those plates having a signal completely out of phase and at a minimum through those plates having a signal completely in phase. Those plates having input signals with phase shift values of $\Delta+X_n$ between 0°/360° and 180° will support some level of current flow greater than the minimum (at 0°/360°) and less than the maximum (at 180°).

Figure 14:
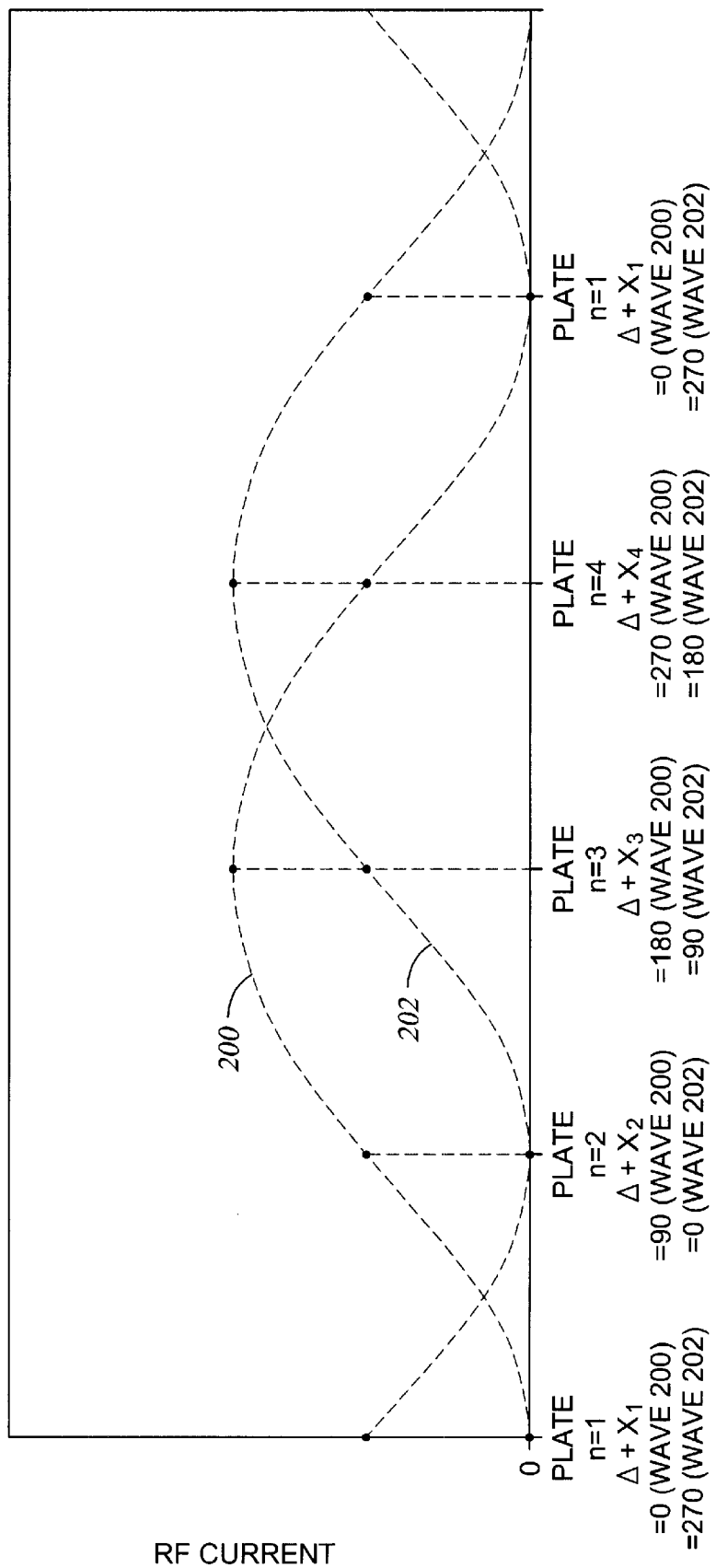
FIG. 14 is a graphical illustration of the RF current on a plurality of phase shifted current return plates.

The foregoing relationship may be illustrated with reference to FIG. 14. FIG. 14 is a graphical illustration of RF current on the current return plates at two instances in time. The RF current is represented by the y-axis and the plates are represented on the x-axis according to their respective phase shifts. The reference wave is sinusoidal, $\Delta$ is zero and any other sources of phase shift are disregarded. Thus, the only phase shift is due to that provided by the phase shift network 318. Because the reference wave is sinusoidal, the RF current values for the plates are along a sinusoidal wave 200. For a sinusoidal wave, as $\Delta$ is changed the RF current from the support member 112 to any given plate increases from zero to a maximum as $\Delta+X_n$ increases from 0 degrees to 180. Similarly, the current will decrease in a sinusoidal fashion as the term $\Delta+X_n$ changes from 180 degrees to 360 degrees. Thus, with an increasing A the wave 200 will effectively move laterally along the x-axis. For example, wave 202 illustrates the current values at the current return plates where Δ is 90 degrees.

Figure 7:
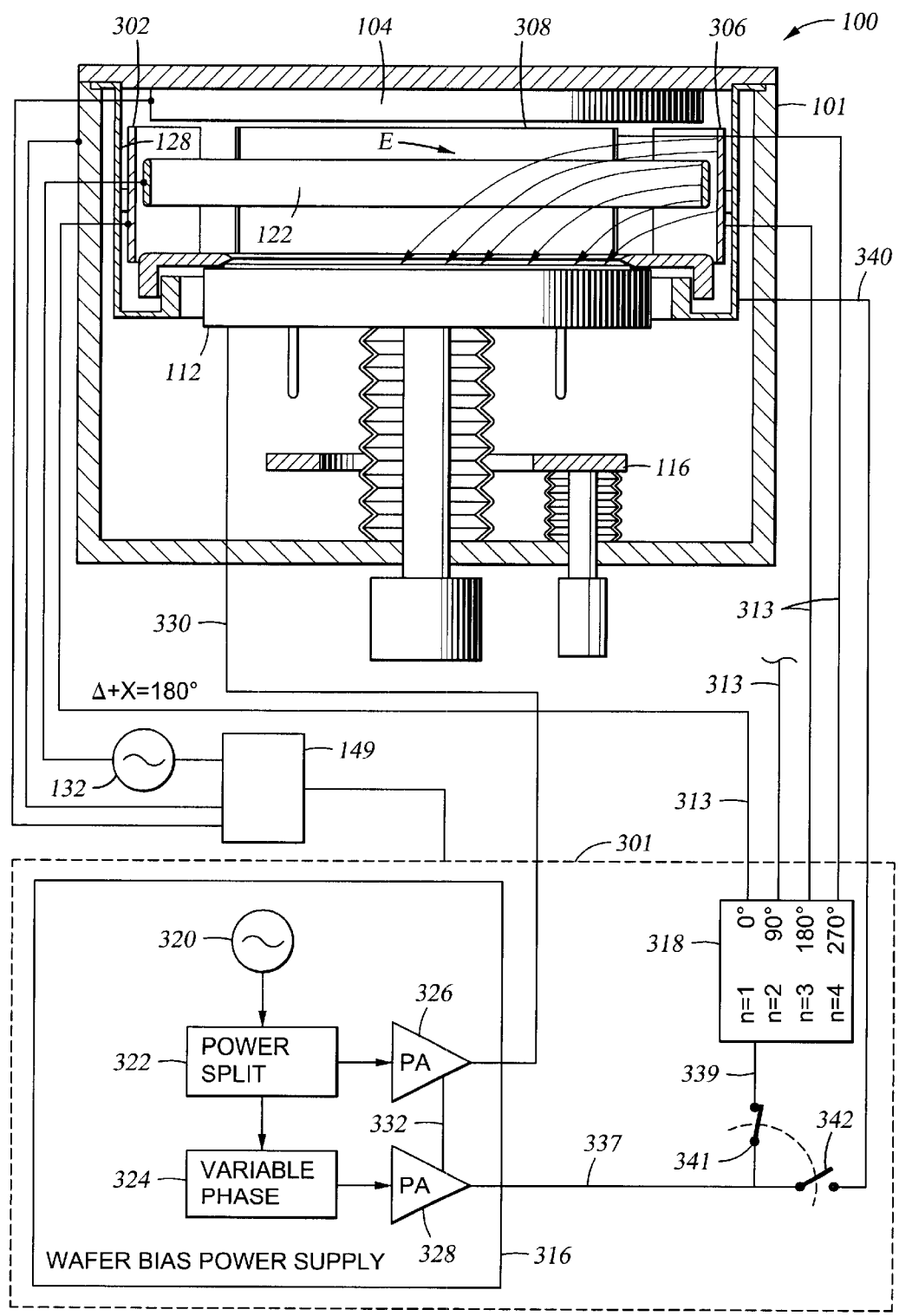
FIG. 7 is a side view of the chamber of FIGS. 4 and 5 showing the orientation of an electric field.

FIG. 7 is a side view of the chamber 100 illustrating the effect of the phase shift on the reference signal. The signal supplied to the first plate 302 from the phase shift network 318 is completely in phase with the reference signal provided to the support member 112, i.e., the phase shift Δ+X$_1$ is 0°. The signal to a third plate 306 from the phase shift network 318 is completely out of phase with the reference signal, i.e., the phase shift Δ+X$_3$ is 180°. As a result, the RF current travels along an electric field E between the support member 112 and the third plate 306. The electric field E, and hence the RF currents, are not present between the first plate 302 and the support member 112 because the signal input to the first plate 302 and the reference signal are completely in phase. The electric field E in FIG. 7 is merely illustrative of an electric field in a vacuum and is not intended to represent an actual electric field under process conditions.

Preferably, the value Δ, as determined by the phase modulator 324, is varied between 0° and 360° at a desired frequency and waveform shape (sinusoidal, square, triangular, etc.) to affect signal modulation. Accordingly, the affinity for RF currents to return through a given plate is modulated as the value A changes. FIGS. 8–11 are top views of the chamber 100 illustrating the modulated electric field with different values for Δ.

In FIG. 8, the strongest electric field E is initially between the first plate 302 and the support member 112. As Δ is varied between 0° and 360°, the strongest electric field E is rotated, or cycled, about the chamber 100. Thus, in FIGS. 8–11, the strongest electric field E is present between the support member 112 and the second plate 304 (FIG. 9), the third plate 306 (FIG. 10), and the fourth plate 308 (FIG. 11), in sequence. The frequency with which the electric field E is rotated about a central axis of the chamber 100 can be adjusted according to a particular application. Although not shown, it is understood that those plates receiving signals phase shifted by some quantity Δ+Xn other than 0°/360° will experience some level of current flow as noted above. However, the related electric field will not be a maximum as when the signal is phased shifted by 180°. Thus, FIGS. 8–11 merely illustrate the orientation of the strongest electric field E during operation.

The result of embodiments of the invention is to produce a modulated electric field E having a substantial horizontal component relative to the support member 112. Referring again to FIG. 7, it can be seen that the electric field E is angled obliquely relative to the substrate 110 disposed on the support member 112. This occurs because the bulk of the RF return currents are flowing to a discrete area one on side of the chamber 100 rather than to an annular member as in prior art. As described with reference to the prior art, in conventional apparatus the electric field between a support member and an RF return member is substantially perpendicular to the support member in proximity thereto. In contrast, the invention produces an electric field E having a substantial horizontal component relative to the support member 112. As a result, ions present in the chamber 100 during operation experience a force due to the electric field E which accelerates the ions horizontally. By modulating the orientation of the electric field E, the ions can be propelled toward the vertical sidewalls of the feature, thereby increasing the deposition thereon.

The result of the RF return path modulation in tandem with a bias to the substrate, i.e., the reference signal, is to cause a corkscrewing effect whereby ions present in the chamber 100 are affected by the rotating electric field E and induced into a spiraling pattern toward the substrate 110. By adjusting the strength and the frequency of rotation of the electric field E, the radius of the spiral can be changed, thereby controlling the rate of deposition on the sidewalls of the device features.

Figure 12:
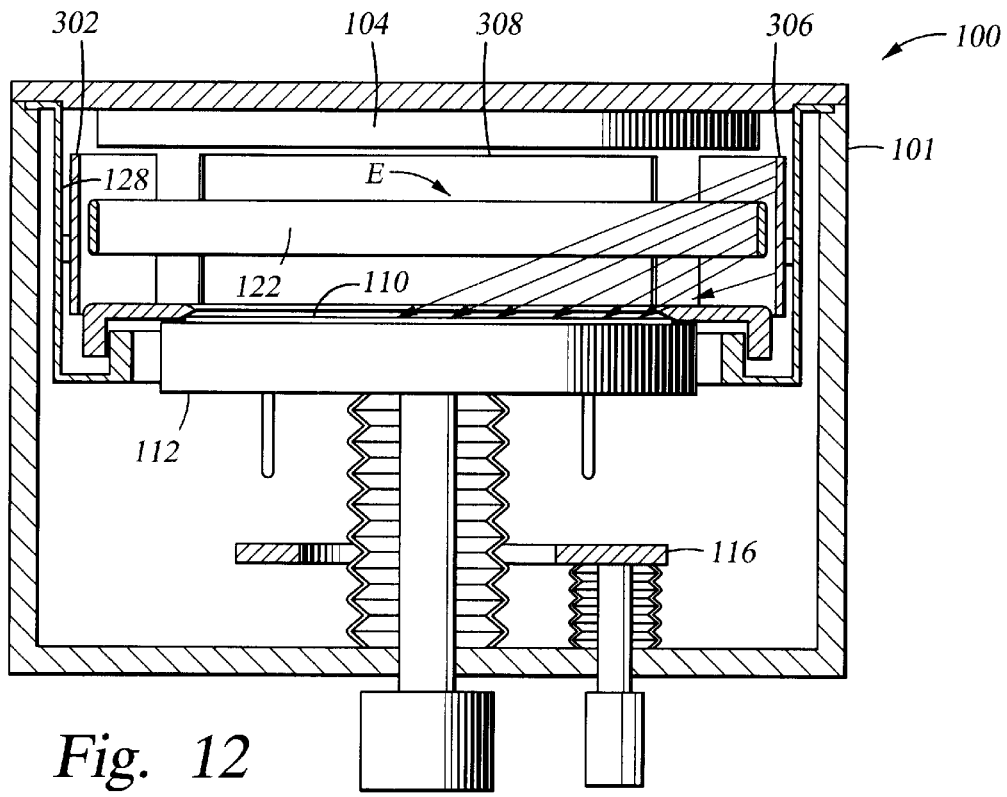
FIGS. 12–13 are top views of the chamber of FIGS. 4–5 and 7 showing orientations of the electric field varying with a phase shifted signal applied to four RF return plates.
Figure 13:
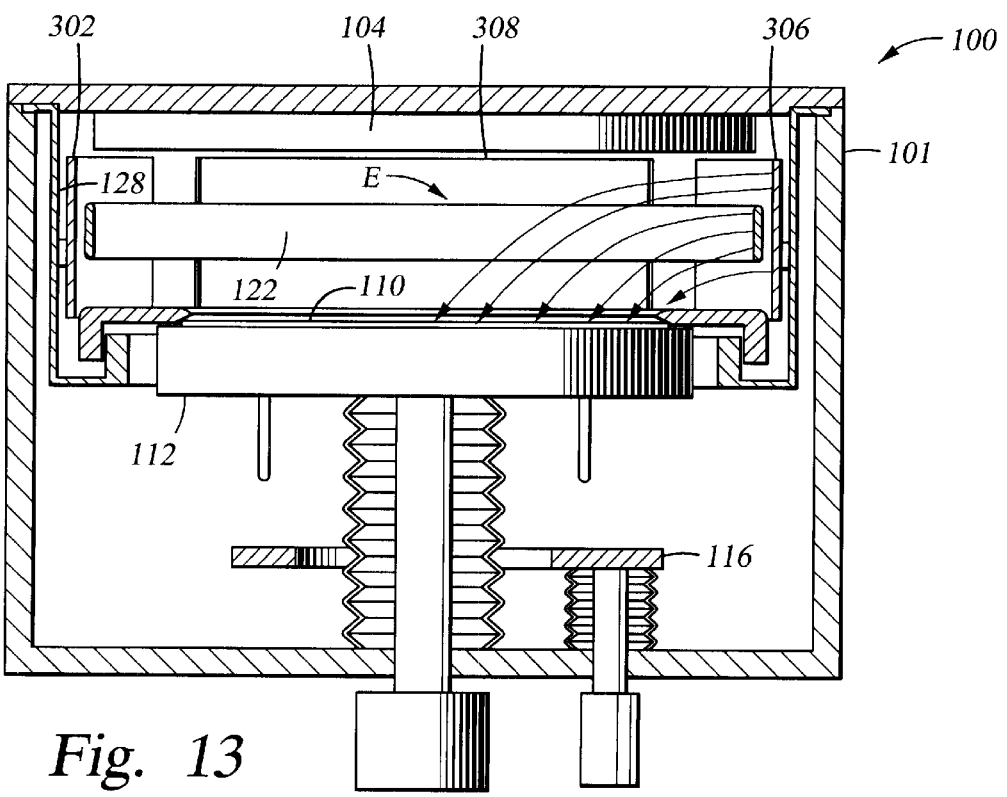

In another embodiment, the return path modulation described above may be coupled with substrate bias modulation. Thus, it is believed that the angular distribution pattern of ions may be controlled by changing the return path as well as by modulating the bias to the substrate 110. Modulating the substrate bias in tandem with modulating the return path provides additional control over the proportions of bottom coverage and sidewall coverage of the device features. In general, the particular orientation of electric * field will depend upon a variety of processing parameters such as current, voltage, sheath thickness, chamber dimensions and the like. FIGS. 12 and 13 are merely illustrative of a possible electric field E orientation under particular conditions where the substrate bias is varied. As shown in FIG. 12, for a given phase shift and substrate bias, the electric field lines exhibit very little curvature. As a result, a large concentration of the ions striking the substrate 110 have a large horizontal velocity component and are deposited the opening of the device features. Holding the phase shift constant, as the bias power is varied, the electric field lines E exhibit increasing curvature resulting in a greater vertical component as shown in FIG. 13. Thus, a higher concentration of the ions are deposited on the bottom of the device features.

Accordingly, the bias to the substrate 110 may be modulated between a high power value and a low power value. Alternatively, the substrate bias may be periodically provided to produce a pulsed signal. Simultaneously, the return path for the RF currents may be modulated in the manner described in reference to FIGS. 8–11 to rotate the horizontal velocity component of the ions about a central axis. Process parameters such as power, voltage, frequency, etc., can be varied according to a particular application.

The invention contemplates various other embodiments adapted to further control the deposition of a film on a substrate. In one embodiment, a chamber component, such as the process shield 128, may be periodically coupled to the signal source 316, thereby allowing the process shield 128 to act as an RF return path member. Referring again to FIGS. 5 and 7, a main line 337 is connected to the output of the second amplifier 328 and splits into a pair of parallel lines 339, 340. A first mode switch 341 is disposed in a primary line 339 coupling the signal source 316 (and more particularly, the second amplifier 328) to the phase shift network 318. A bypass line 340 having a second mode switch 342 disposed therein is shown coupled at one end to the process shield 128 and at another end to the signal source 316 (and more particularly, the second amplifier 328). The switches 341, 342 are synchronously and alternatively operated such that when one of the switches 341, 342 is open the other is closed. While the switch 341 remains closed and the second switch 342 remains open, the return currents are routed through the return plates 302, 304, 306, 308 in the manner described above, thereby achieving conformal and uniform coverage of the sidewalls of the device features. Upon opening the mode switch 341 and closing the switch 342, the phase shift network 318 and return plates 302, 304, 306, 308 are bypassed and the return currents travel through the annular process shield 128, the bypass line 340 and then to the signal source 316. As a result, with the first mode switch 341 open and the second mode switch 342 closed, the electric field lines E assume a more perpendicular orientation relative to the substrate 110, thereby achieving greater bottom coverage. During processing, the mode switches 341, 342 may be actuated periodically to effect the desired proportions of sidewall and bottom coverage. The frequency at which the switches 341, 342 are closed and opened can be varied to suit a particular application.

While the foregoing is directed to the preferred embodiment of the present invention, other and further embodiments of the invention may be devised without departing from the basic scope thereof, and the scope thereof is determined by the claims that follow.

What is claimed is:

1. A plasma processing system, comprising:
   (a) a processing chamber body forming a cavity;
   (b) a target disposed in the cavity;
   (c) a substrate support member disposed in the cavity, wherein the cavity includes a processing region disposed between the target and the substrate support;
   (d) a coil disposed about the processing region;
   (e) at least two current return plates disposed in the cavity; and
   (f) a phase shift power source comprising a signal generator electrically coupled to the support member and the at least two current return plates.

2. The system of claim 1, wherein the phase shift power source further comprises a phase modulator; and further comprising a phase shift device electrically coupled between the phase modulator and the at least two current return plates.

3. The system of claim 1, wherein the phase shift power source is configured to phase shift a reference signal output from the signal generator by about 0 degrees to about 360 degrees.

4. The system of claim 1, further comprising a phase shift device disposed between the phase shift power source and the at least two current return plates.

5. The system of claim 4, wherein the phase shift device comprises a phase shifted output for each of the at least two current return plates.

6. The system of claim 1, wherein the phase shift power source comprises a phase modulator electrically coupled to the signal generator.

7. The system of claim 6, further comprising:
   a power splitter electrically connected to the signal generator; the power splitter comprising a first output to the support member and a second output to the phase modulator.

8. The system of claim 7, further comprising a first amplifier electrically connected to the first output and a second amplifier electrically connected to the second output; wherein the first amplifier is electrically connected to the support member and the second amplifier is electrically connected to the at least two current return plates.

9. The system of claim 8, wherein the first and the second amplifiers are connected to a common and isolated ground.

10. The system of claim 8, further comprising a phase shift device electrically connected between the second amplifier and the at least two current return plates.

11. The system of claim 7, further comprising:
   a phase shift device electrically connected between the phase modulator and the at least two current return plates;
   an annular chamber shield disposed in the cavity and selectively electrically coupled to the phase modulator.

12. The system of claim 11, wherein the annular chamber shield is disposed between the processing chamber body and the at least two current return plates.

13. The system of claim 11, further comprising a first switch disposed to selectively couple the annular chamber shield and the phase shift power source.

14. The system of claim 13, further comprising:
   a phase shift device electrically coupled between the phase modulator and the at least two current return plates; and
   a second switch disposed to selectively couple the phase shift power source and the phase shift device; wherein the first switch and the second switch are alternatively open.

15. A method for operating a deposition vacuum chamber comprising a target at one end of the vacuum chamber, a substrate support member on another end of the vacuum chamber and at least two current return plates disposed between the ends of the vacuum chamber, the method comprising:
   (a) supplying a first signal to the target;
   (b) supplying a reference signal to the substrate support member; and
   (c) modulating a resultant electric field between the substrate support member and the at least two current return plates by changing a phase relationship between the reference signal and a phase shifted signal on the at least two current return plates.

16. The method of claim 15, further comprising generating the reference signal and the phase shifted signal from a common signal generator.

17. The method of claim 15, wherein modulating the resultant electric field comprises rotating the electric field 360° about the substrate support member.

18. The method of claim 15, wherein modulating the resultant electric field comprises varying the strength of the electric field.

19. The method of claim 15, further comprising providing a coil signal to an inductive coil disposed between the ends of the vacuum chamber.

20. The method of claim 15, further comprising modulating the reference signal.

21. The method of claim 15, wherein the reference signal and the phase shifted signal are RF signals.

22. A plasma processing system, comprising:
   (a) a processing chamber body forming a cavity;
   (b) a substrate support member disposed in the cavity;
   (c) at least two current return plates disposed in the cavity; and
   (d) a phase shift power source comprising (i) a signal generator electrically coupled to the support member and the at least two current return plates and (ii) a phase modulator electrically coupled between the signal generator and the at least two current return plates.

23. The system of claim 22, further comprising an inductive coil disposed in the cavity and wherein the at least two current return plates are disposed between the coil and the processing chamber body.

24. The system of claim 22, wherein the phase modulator is configured to phase shift a reference signal output from the signal generator by about 0 degrees to about 360 degrees.

25. The system of claim 22, wherein the phase shift power source comprises a reference signal output connected to the support member and a phase shifted reference signal output connected to the at least two current return plates.

26. The system of claim 22, further comprising a phase shift device electrically coupled between the phase modulator and the at least two current return plates.

27. The system of claim 26, wherein the phase shift device comprises a phase shifted output for each of the at least two current return plates.

28. The system of claim 22, further comprising a power splitter electrically connected to the signal generator; the power splitter comprising a first output to the support member and a second output to the phase modulator.

29. The system of claim 28, further comprising a first amplifier electrically connected to the first output and a second amplifier electrically connected to the second output; wherein the first amplifier is electrically connected to the support member and the second amplifier is electrically connected to the at least two current return plates.

30. The system of claim 29, wherein the first and the second amplifiers are connected to a common and isolated ground.

31. The system of claim 29, further comprising a phase shift device electrically connected between the second amplifier and the at least two current return plates.

32. The system of claim 22, further comprising:
a phase shift device electrically connected between the phase modulator and the at least two current return plates;
an annular chamber shield disposed in the cavity and selectively electrically coupled to the phase modulator.

33. The system of claim 32, wherein the annular chamber shield is disposed between the processing chamber body and the at least two current return plates.

34. The system of claim 32, further comprising a first switch disposed to selectively couple the annular chamber shield and the phase shift power source.

35. The system of claim 34, further comprising:
a phase shift device electrically coupled between the phase modulator and the at least two current return plates; and
a second switch disposed to selectively couple the phase shift power source and the phase shift device; wherein the first switch and the second switch are alternatively open.

* * * * *